United States Patent
Pietzsch

(10) Patent No.: US 9,600,606 B2
(45) Date of Patent: Mar. 21, 2017

(54) METHOD FOR THE TEMPORARY SEPARATION OF OBJECT DATA OF DESIGN MODELS

(71) Applicant: dSPACE digital signal processing and control engineering GmbH, Paderborn (DE)

(72) Inventor: Torsten Pietzsch, Paderborn (DE)

(73) Assignee: dSPACE digital signal processing and control engineering GmbH, Paderborn (DE)

(*) Notice: Subject to any disclaimer, the term of this patent is extended or adjusted under 35 U.S.C. 154(b) by 760 days.

(21) Appl. No.: 14/035,270

(22) Filed: Sep. 24, 2013

(65) Prior Publication Data

US 2014/0088932 A1    Mar. 27, 2014

(30) Foreign Application Priority Data

Sep. 25, 2012 (EP) .................................... 12185821

(51) Int. Cl.
*G06F 17/50* (2006.01)
*G06F 9/44* (2006.01)
*G05B 19/042* (2006.01)

(52) U.S. Cl.
CPC ......... *G06F 17/50* (2013.01); *G05B 19/0428* (2013.01); *G06F 8/24* (2013.01);
(Continued)

(58) Field of Classification Search
None
See application file for complete search history.

(56) References Cited

U.S. PATENT DOCUMENTS 5,678,038 A * 10/1997 Dockter ............ G06F 17/30294
707/695
6,148,349 A * 11/2000 Chow ............... G06F 15/17375
709/214
(Continued)

FOREIGN PATENT DOCUMENTS

| EP | 1 914 610 A2 | 4/2008 |
| WO | WO 00/02107 A2 | 1/2000 |
| WO | WO 2010/028760 A1 | 3/2010 |

OTHER PUBLICATIONS

Lykovic et al. Tracing Evolution Changes of Software Artifacts through Model Synchronization Proceedings of the 20th IEEE ICMS, 2004).*

(Continued)

*Primary Examiner* — Omar Fernandez Rivas
*Assistant Examiner* — Cuong Luu
(74) *Attorney, Agent, or Firm* — Muncy, Geissler, Olds & Lowe, P.C.

(57) ABSTRACT

A method for editing a computer-aided design model for developing electronic control units in a design environment, whereby the design model comprises at least one model object with first data. The method begins with the reading of all model objects of the design model and the reading of an allocation list, which assigns a particular globally unique key to each model object. If the first data are available, the reading of the first data from a first memory location follows. Then, assignment of the first data to the model object based on the globally unique key occurs, so that the first data are available during editing of the design model. If the first data are not available, assignment of the globally unique key to the model object occurs, so that the globally unique key is available during tediting of the design model.

5 Claims, 4 Drawing Sheets

(52) U.S. Cl.
CPC ...... *G06F 8/35* (2013.01); *G05B 2219/24163* (2013.01); *Y02P 90/265* (2015.11)

(56) References Cited

U.S. PATENT DOCUMENTS

| | | | |
|---|---|---|---|
| 6,377,960 B1* | 4/2002 | Qiu | G06F 17/30309 |
| 2002/0165961 A1* | 11/2002 | Everdell | H04L 41/22 |
| | | | 709/225 |
| 2003/0126195 A1* | 7/2003 | Reynolds | G06F 1/14 |
| | | | 709/203 |
| 2003/0229522 A1* | 12/2003 | Thompson | G06Q 10/067 |
| | | | 705/4 |
| 2004/0031030 A1* | 2/2004 | Kidder | G06F 1/14 |
| | | | 717/172 |
| 2009/0125796 A1* | 5/2009 | Day | G06F 9/4443 |
| | | | 715/219 |
| 2009/0276771 A1* | 11/2009 | Nickolov | G06F 9/4856 |
| | | | 717/177 |
| 2010/0070448 A1* | 3/2010 | Omoigui | H01L 27/1463 |
| | | | 706/47 |
| 2010/0250497 A1* | 9/2010 | Redlich | F41H 13/00 |
| | | | 707/661 |
| 2012/0069131 A1* | 3/2012 | Abelow | G06Q 10/067 |
| | | | 348/14.01 |
| 2013/0080640 A1* | 3/2013 | Rai | G06Q 30/0224 |
| | | | 709/226 |
| 2013/0238795 A1* | 9/2013 | Geffin | G06F 1/206 |
| | | | 709/224 |
| 2013/0262685 A1* | 10/2013 | Shelton | G06F 1/206 |
| | | | 709/226 |
| 2014/0039683 A1* | 2/2014 | Zimmermann | G06F 1/206 |
| | | | 700/275 |
| 2016/0173925 A1* | 6/2016 | Gordon | H04N 21/2668 |
| | | | 725/14 |

OTHER PUBLICATIONS

European Search Report & computer generated English translation thereof, dated Jun. 11, 2013.
Simulink® Dynamic System Simulation for MATLAB®; Using Simulink Version 3; Jan. 1999; The Math Works, Inc.
Visu It! Visual Information Technologies GmbH; Data Declaraton System V5.6.
MonkeyProof Data Dictionary Manager ; MonkeyProof Solutions BV; Jun. 25, 2012.

* cited by examiner

METHOD FOR THE TEMPORARY SEPARATION OF OBJECT DATA OF DESIGN MODELS

This nonprovisional application claims priority to European Patent Application No. EP 12185821.1, which was filed on Sep. 25, 2012, and to U.S. Provisional Application No. 61/705,407, which was filed on Sep. 25, 2012, and which are both herein incorporated by reference.

BACKGROUND OF THE INVENTION

Field of the Invention

The present invention relates to a method for editing a computer-aided design model for developing electronic control units in a design environment.

Description of the Background Art

Design models typically relate to models for mechatronically realized control and/or regulation in which physical parameters for control devices are to be assigned data, i.e., provided with additional data. These parameters are determined by means of sensors and processed in a control device by an algorithm into control variables for actuators. A prior-art application program in this field is, for example, TargetLink. Additional data can be applied there to a design model such as, e.g., information on scaling (conversion of the determined physical parameter into a numerical representation in the control device), which values can be calibrated later, whether the variables are stored in RAM or ROM after code generation, with which visibility they are applied, or whether a variable can be optimized (if it must be accessible to calibration or diagnostic systems, it may not be "optimized away"). This additional information is not relevant to the actual design environment, but is needed by another application program. For example, the additional data provide code generation-specific data for TargetLink. The invention can also be applied analogously, however, to additional data for requirements engineering tools or calibration tools.

It is typical in the model-based development environment to augment the design models with additional data for the diverse development steps.

Typically, these additional data are bound directly to the model object and are thereby linked to it persistently. As soon as the additional data are linked to the model objects, the design model can no longer be edited separately from the additional data.

SUMMARY OF THE INVENTION

It is therefore an object of the present invention to provide a method which permits the flexible editing of a design model regardless of whether additional data are available for the individual steps.

According to an embodiment of the invention, the problem is solved by a method, whereby the design model comprises at least one model object with first data, whereby the first data are additional data that are used only for individual development steps of the control device. The method also comprises the following steps: reading all model objects of the design model in the development environment; reading an allocation list, which assigns a particular globally unique key to each model object; either if the first data are available: reading the first data from a first memory location, whereby the first data contain the globally unique key, and then assigning the first data to the model object based on the global unique key, so that the first data are available during the editing of the design model; or if the first data are not available: assigning the globally unique key to the model object, so that the globally unique key is available during the editing of the design model; editing of the design model; saving the allocation list in which the globally unique key is assigned to the model object. Whereby the step of saving can include: if the first data are available during the editing, generating a new globally unique key, which replaces the previous globally unique key, if the first data are not available during editing, retaining the globally unique key; saving the first data together with the globally unique key; and saving all model objects of the design model.

The invention is based on the realization that with increasing complexity of the development steps, an increasing number of development participants are also involved in the development process. It was realized here that the persistent saving of additional data for a design model is not desirable if the design model is to be exchanged between different development participants, but certain information is not to be disclosed to protect intellectual property.

A major advantage of the present invention is that through the use of an allocation list between the additional data and the globally unique key, there is also the possibility of editing the design model in the case that the additional data are not available. In this case, the design model is saved after editing with the same globally unique keys for the particular model objects, as they were bound to the model objects from the originally read allocation list. This globally unique key is saved in the allocation list after editing of the design model. If the modified design model is now opened by a development participant to whom the additional data are available, these are now again attached to the model via the unique key. If the additional data are available and expanded or modified during further development of the development model, a new globally unique key is generated, which is entered in the allocation list.

It was realized according to the invention that not only protection of intellectual property can be achieved via a temporary separation of the data, but moreover the design model and additional data of different model objects can be protected from modifications separated from one another in that the respective files are managed separately from one another in a version control system. For example, it is thus possible that the model structure and object parameterization remain unchanged and only the additional data can be changed that must be changed for code generation from the model.

The unavailability of the first data thereby comprises the cases in which the first data are not available or the first data are protected by a password or by access authorization.

According to another embodiment, the method is designed further in such a way that the allocation list defines access authorization for different users or user groups, and the step of assigning the first data to the model object, if the first data are available, comprises: checking a user's access authorization for the first data; if the user has access rights, assigning the first data to the model object, so that the first data are available during the editing of the design model; or if there are no access rights, assigning the globally unique key to the model object, so that only the globally unique key is available during the editing of the design model.

A further embodiment of the method of the invention comprises reading all model objects of the design model in the development environment. This step comprises creating and reading the first model object from a model library.

This method can be developed further in that the step "reading an allocation list that assigns a globally unique key to the model object" comprises reading an allocation list associated with the model object from the model library, which assigns a globally unique key to the model object.

It was realized according to the invention that when model objects are also instantiated from libraries for a design model, the instances normally inherit both the (sub-)model structure and the associated data. The present method moreover allows constellations in which the additional data can vary from one another from instance to instance, so that there is a desired identity of the (sub-)model structure, but an identity of the additional data of a model object is not necessarily specified. With the repeated use of a model object, which was instantiated from a model object library, therefore according to the invention different additional data can be attached.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus, are not limitive of the present invention, and wherein.

DETAILED DESCRIPTION

Figure 1:
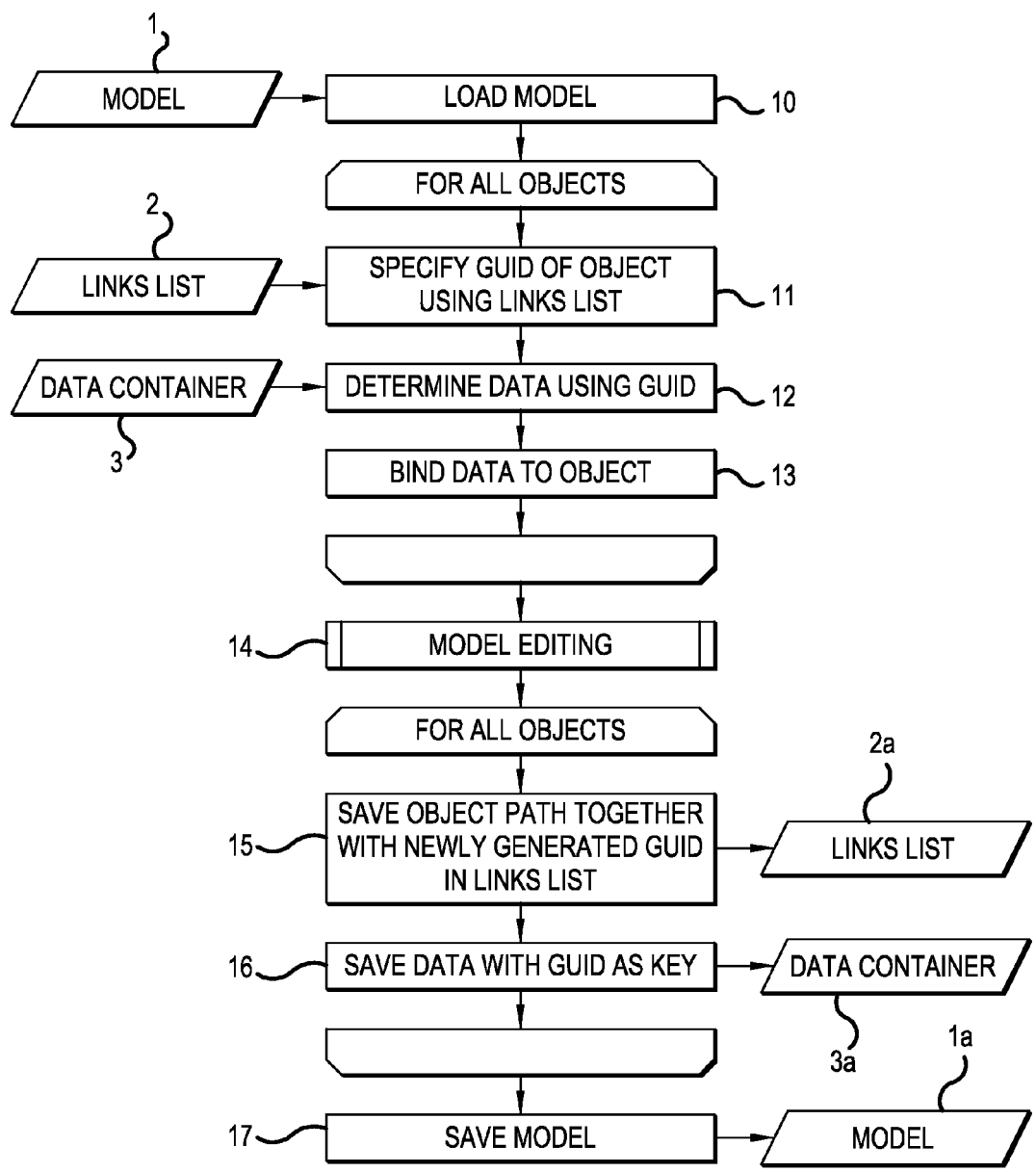
FIG. 1 is a flowchart of an embodiment of the method of the invention in the case that the additional data are available.

FIG. 1 shows a flowchart of an exemplary embodiment of the method of the invention in the case that the additional data are available during editing. At the beginning of the method, design model 1 is loaded into a computer-aided development environment 10. Allocation list 2 is also loaded into the development environment, so that it is available for further use. Next, for each model object of the design model a globally unique key (GUID, for global unique identifier) 11 is specified, which is assigned to the particular model object based on allocation list 2. Additional data 3 associated with a model object are now determined via the globally unique key 12. In another step these data are bound to the model object 13, whereby this can occur by direct binding of the additional data to the development model and also by binding of dynamic links to the particular memory location of the additional data. Next, the design model can be edited in its entirety. In so doing, changes, additions, or deletions can be made in the design model itself, as well as additional data of the model objects can be changed, added to, or deleted. After the editing ends, a new globally unique key is generated for each model object and linked to the model object in a new allocation list 2a. This occurs by assigning the model object path to the particular globally unique key of the model object. The allocation list is then saved separately from the design model or in a container file together with the design model. A container file is understood to be a file that for its part may contain different files and file types. Additional data 3a of each model object are also saved separately together with the newly generated globally unique key 16. After the separation of the additional data of design model 1a has taken place, the design model is saved in a last step 17.

Figure 2:
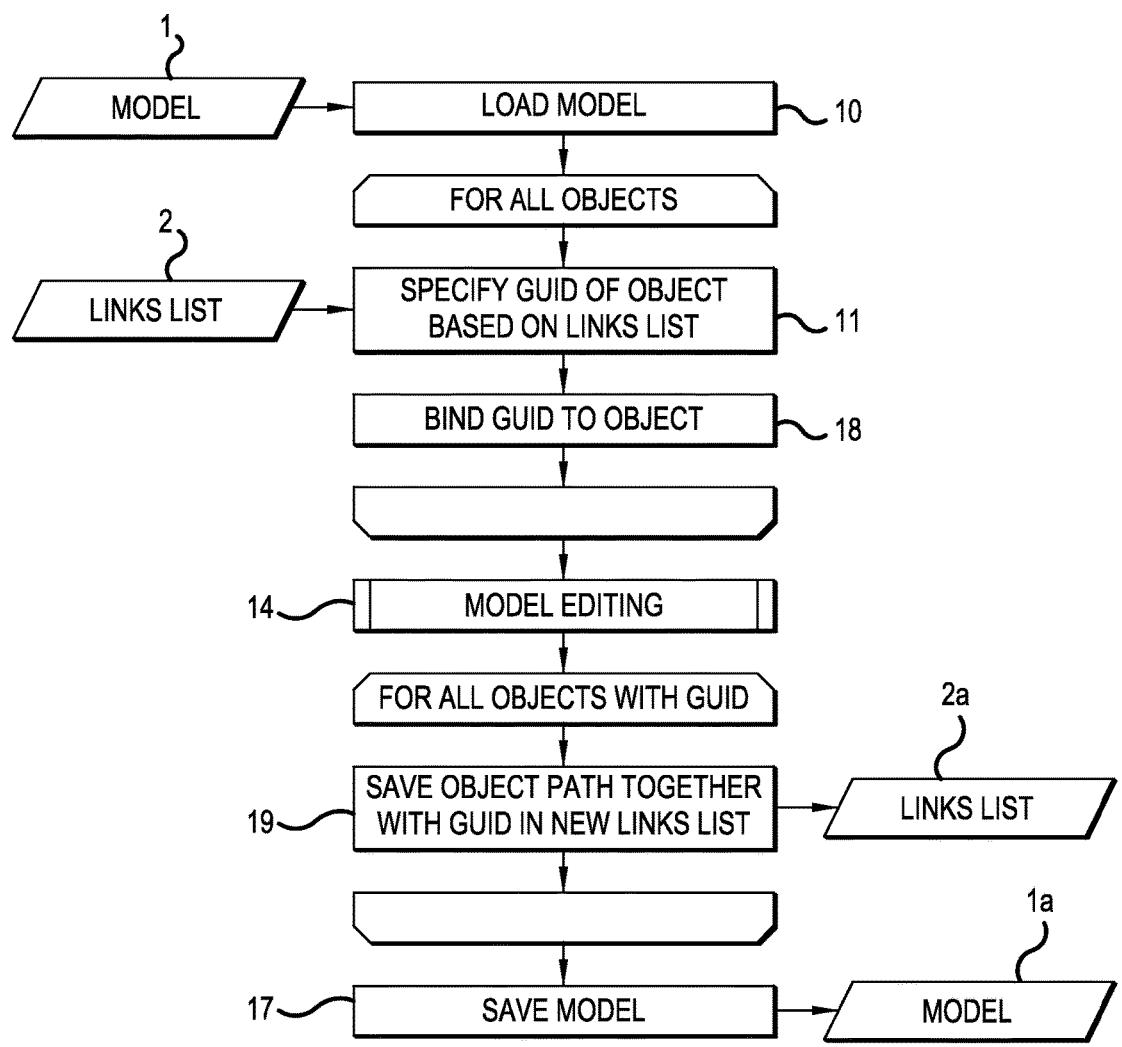
FIG. 2 is a flowchart of an embodiment of the method of the invention in the case that the additional data are not available.

FIG. 2 shows another flowchart for an embodiment of the method of the invention in which the additional data of the model objects are not available. The method begins with the loading of design model 1 into the computer-aided development environment. As in the previous embodiment, each model object is assigned a globally unique key via an allocation list 2 also loaded into the development environment. Because no additional data are available for the model objects, the globally unique key itself is bound to the model object 18. Next, the design model is edited 14, without use of the additional data. If a model object is copied, the copy receives the same globally unique key as the original. After the editing of the design model, an allocation list 2a is saved which contains the globally unique key bound to the model objects. If a model object was removed from the model, the assignment of the associated globally unique key to the additional data is also removed from the allocation list. If a model object was created as part of the editing, a new globally unique key is assigned for this model object and a new entry with this globally unique key is made in the allocation list. However, this new entry still cannot be assigned any additional data or only default data. As the last step, the edited design model 1a is saved.

Apart from the cases described in detail, in which either the additional data of all model objects are available to a model developer or the case in which additional data are not available for any of the model objects, the method also comprises cases in which additional data are available only for some of the model objects. For those model objects for which the additional data are available, process steps 11-13 then take place, and after the completed model editing, steps 15 and 16 are executed; whereas for the other model objects, for which the additional data are not available, process steps 11 and 18, as well as 19, are executed.

In this regard, the unavailability of the additional data of a model object can occur in that the physical storage location of these data are in fact not available to the model developer. It is also possible, however, that the additional data are protected with a password model object-dependent or model object-independent and access is denied as long as the model developer does not know the associated passwords for the individual model objects. In this case as well, the additional data of the password-protected model object are not available for model editing. In principle, as in password-protected access, personal access rights can also be passed out. These can be managed, for example, as a further entry in the allocation lists, so that the development environment realizes independently whether a model developer is authorized to access certain data. In general, access can occur in this case in a differentiated manner. Separate authorizations can occur which grant a model developer read permission, write permission, or delete permission for the additional data.

Figure 3:
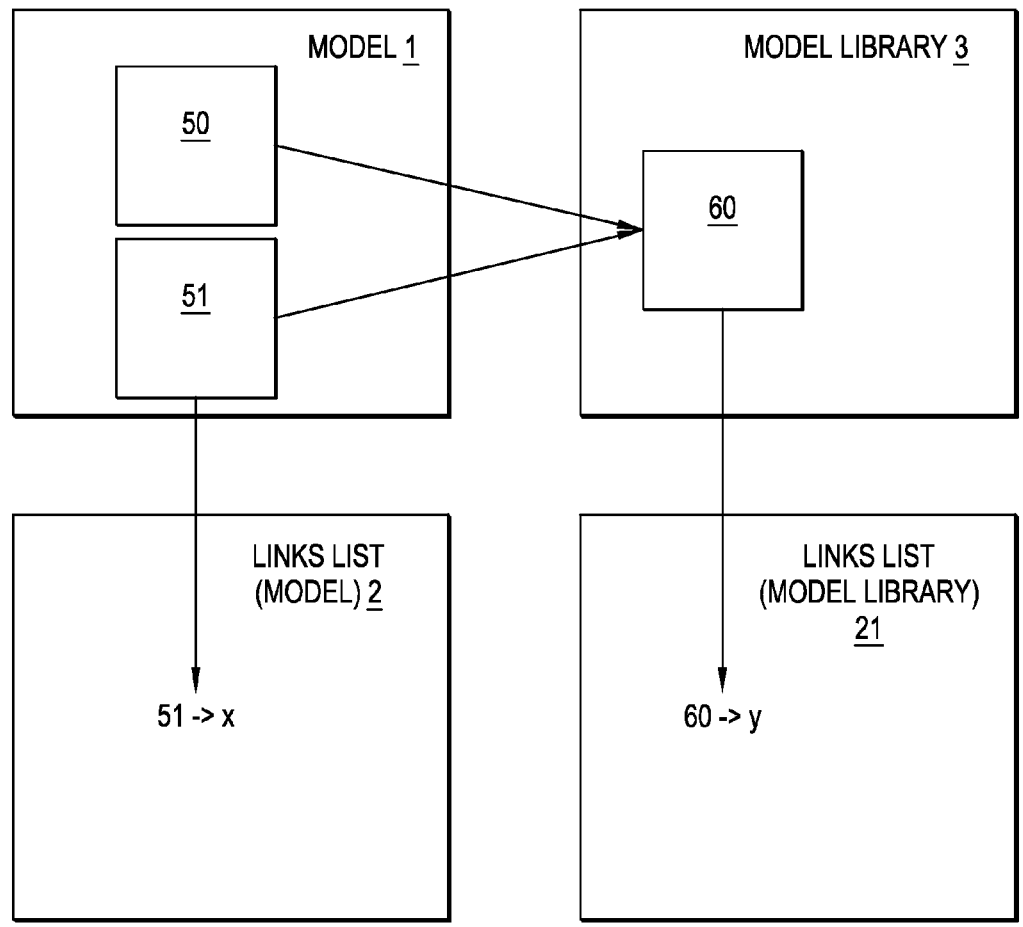
FIG. 3 is an overview of another embodiment of the method which takes into account that model objects can be instantiated from a model library object.

FIG. 3 shows an overview of another embodiment of the method. Said embodiment takes into account that model objects 50 and 51 can be instantiated from a model library object 60. In this regard, according to the invention it is assumed that model library object 60 contains an associated allocation list 21. It is immaterial for the invention whether allocation list 21 of model library 3 is saved in a file together with allocation list 2 of design model 1 or separately therefrom. If a model object 50, 51 is instantiated from a model library object 60, it receives the additional data of model object 50, 51 according to allocation list 21 of model library 3 or if this is not available the globally unique key of model object 50 according to allocation list 21 of model library 3. For this model object 50, the management of the additional data therefore occurs generally not via allocation list 2 of design model 1 but via allocation list 21 of model library 3. If, however, a model object 50, which was instantiated from a model library object 60, is linked to additional data different from those according to allocation list 21 of the model library or changes the additional data linked with model object 50, the additional data of corresponding model object 50 are then managed in allocation list 2 of the design model.

Figure 4:
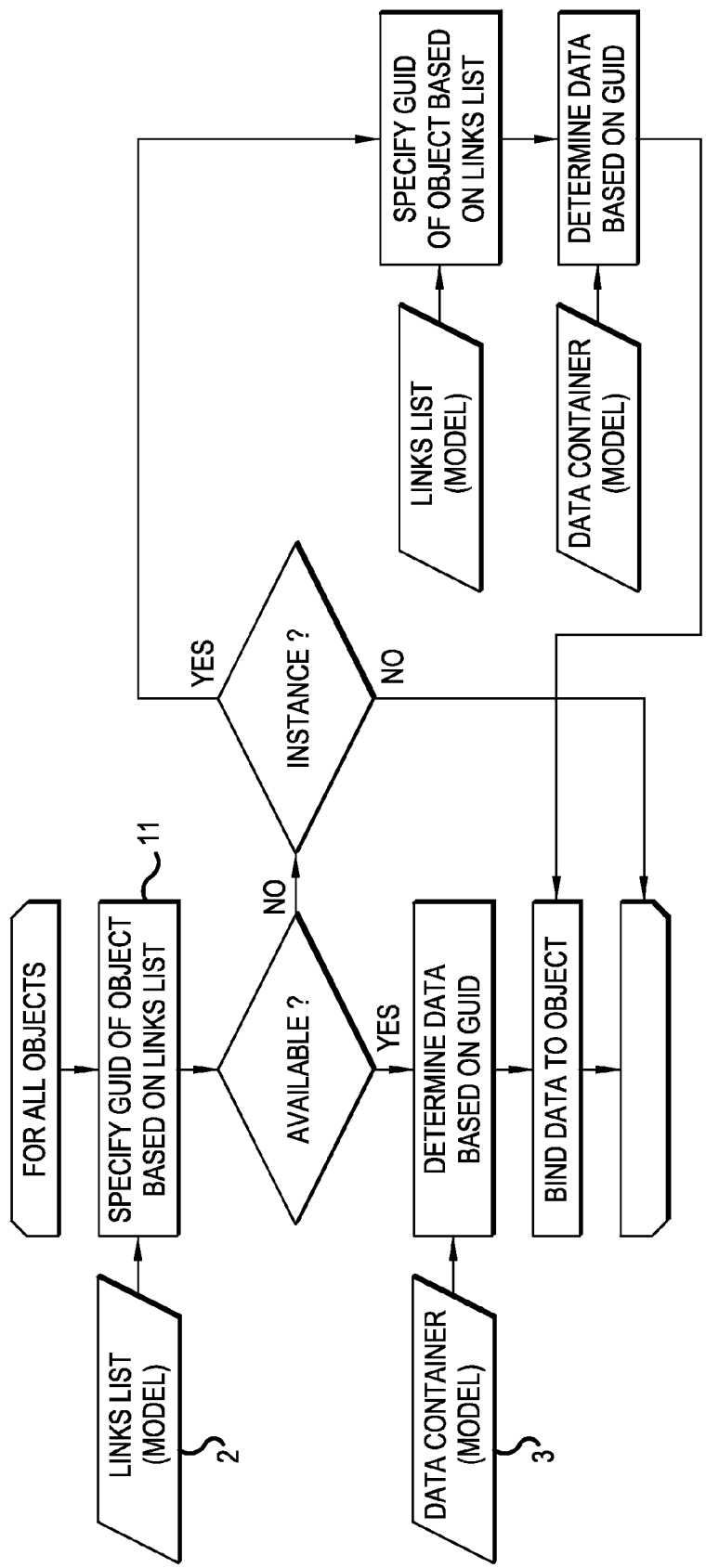
FIG. 4 is a flowchart of an embodiment of the method of the invention in the case that model objects are loaded from a library.

FIG. 4 shows a flowchart for this embodiment of the method of the invention. In this embodiment, after loading of the development model and allocation list 2, a check is run for each model object whether a globally unique key can be assigned to the model object based on allocation list 2. If this is the case, the model object is linked to the assigned additional data or if these were not available, the model object is assigned the globally unique key. In so doing, it is immaterial whether the model object is an instance of a library object with its own or changed additional data or not an instance of a library object. If a model object cannot be assigned a globally unique key based on allocation list 2 of the model, it is assumed that this is an instance of a model object from the model library. In this case, the globally unique key of the model object is specified based on the globally unique key of the associated allocation list 21 of the model library and then the corresponding additional data are assigned to the model object. If the additional data are not available, the globally unique key itself is bound to the model objects from the model library. The method further takes into account the case that a model object cannot be assigned either a globally unique key via allocation list 2 or via allocation list 21 in step 23. In this case, no assignment of a globally unique key occurs before the editing of the model, but a new globally unique key for the corresponding model object would be generated when the model is saved, as already described for a newly created object.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for editing a computer-aided design model for developing electronic control units in a design environment, the design model comprises at least one model object with first data or at least one model object without the first data, the first data being additional data that are used only for individual development steps of the control device, the method comprising:

reading all model objects of the design model in the development environment;

reading an allocation list that maps a globally unique key that is particular to each model object;

determining whether the first data are available, if the first data are available:

reading the first data from a first memory location, wherein the first data contain the globally unique key, and then the first data are assigned to a particular model object of the at least one model object based on the global unique key contained in the first data, using the allocation list to map the first data to the particular model object, so that the first data are available during editing of the design model, or if the first data are not available:

assigning the globally unique key particular to the model object so that the globally unique key is available during the editing of the design model;

editing the design model; and saving the allocation list in which the globally unique key is assigned to the model object, said saving comprising:

if the first data are available during the editing, generating a new globally unique key, which replaces the globally unique key assigned to the model object;

if the first data are not available during editing, retaining the globally unique key assigned to the model object;

saving the first data together with the globally unique key or the new globally unique key; and saving all model objects of the design model.

2. The method according to claim 1, wherein the first data are not available, if (i) the first data does not exist;

(ii) the first data are protected by a password; or (iii) the first data are protected by an access authorization.

3. The method according to claim 1, wherein the allocation list defines access authorization for different users or user groups, and wherein in the step of assigning the first data to the model object, if the first data does exist, comprises:

checking a user's access authorization for the first data;

if the user has access rights, assigning the first data to the model object, so that the first data are available during editing of the design model; and if there are no access rights, assigning the globally unique key particular to the model object, so that only the globally unique key is available during editing of the design model.

4. The method according to claim 1, wherein the step of reading of all model objects of the design model in the development environment comprises creating and reading the first model object from a model library; and wherein the step of reading the allocation list, which maps the globally unique key to the first model object, comprises reading the allocation list associated with the first model object from the model library, which maps the globally unique key to the first model object.

5. The method according to claim 4, wherein the first model object is assigned its own unique global key or wherein the first model object receives a global key of the model library object.

* * * * *